(12) United States Patent
Syri et al.

(10) Patent No.: US 6,573,593 B1
(45) Date of Patent: *Jun. 3, 2003

(54) INTEGRATED CIRCUIT WITH A HOUSING ACCOMMODATING THE INTEGRATED CIRCUIT

(75) Inventors: Erich Syri, Wenzenbach (DE); Bernd Römer, Bernhardswald (DE)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/272,668

(22) Filed: Mar. 18, 1999

Related U.S. Application Data

(63) Continuation of application No. PCT/DE97/02067, filed on Sep. 15, 1997.

(51) Int. Cl.⁷ ................................................ H01L 23/48
(52) U.S. Cl. .................... 257/690; 257/693; 257/735
(58) Field of Search ................................ 257/737, 738, 257/778, 779, 780, 784, 678, 690, 692, 693, 734, 735; 361/728, 729, 730, 733, 760, 772, 773

(56) References Cited

U.S. PATENT DOCUMENTS 5,866,949 A * 2/1999 Schueller .................... 257/778
5,889,332 A * 3/1999 Lawson et al. .............. 257/778

FOREIGN PATENT DOCUMENTS

| DE | 3712178 C2 | 8/1992 |
| EP | 0571749 A1 | 12/1993 |
| JP | 61120454 | 6/1986 |
| JP | 4-280695 | 10/1992 |
| JP | 04280695 | 10/1992 |
| JP | 05343579 | 12/1993 |
| JP | 5-343579 | 12/1993 |
| JP | 6-243677 | 9/1994 |
| JP | 7-226455 | 8/1995 |

OTHER PUBLICATIONS

Published International Application No. 97/14183 (Knecht et al.), dated Apr. 17, 1997.

* cited by examiner

Primary Examiner—David L. Talbott
Assistant Examiner—Alonzo Chambliss
(74) Attorney, Agent, or Firm—Laurence A. Greenberg; Werner H. Stemer; Ralph E. Locher

(57) ABSTRACT

An integrated circuit having a housing accommodating the integrated circuit. It being possible for the integrated circuit to be put optionally into one of a plurality of different operating modes by virtue of the selective provision of electrical connections between specific contact points constructed on the integrated circuit. The device described is distinguished by the fact that all the contact points of the integrated circuit which are provided for the operation and configuration of the integrated circuit are connected to terminal elements of the housing with which external contact can be made.

8 Claims, 1 Drawing Sheet

INTEGRATED CIRCUIT WITH A HOUSING ACCOMMODATING THE INTEGRATED CIRCUIT

CROSS-REFERENCE TO RELATED APPLICATION

This is a continuation of copending International Application PCT/DE97/02067, filed Sep. 15, 1997, which designated the United States.

BACKGROUND OF THE INVENTION

Field of the Invention

The present invention relates to an integrated circuit with a housing accommodating the integrated circuit. It being possible for the integrated circuit to be put optionally into one of a plurality of different operating modes by virtue of the selective provision of electrical connections between specific contact points constructed on the integrated circuit.

A unit of this type, which is referred to below in short as "device", is, by way of example (but not exclusively), a memory device which is provided, by way of example (but once again not exclusively), for mounting on a single in-line memory module (SIMM).

A SIMM equipped with conventional memory devices is shown in FIG. 2. The memory devices are soldered onto a printed circuit board. Along one of its edges, the printed circuit board is provided with a multiplicity of contact elements situated next to one another, with the result that it can be plugged onto a further printed circuit board (not shown in the figure), more precisely into a printed circuit board connector provided on the same.

A known area of application for such SIMMs are personal computers, where the SIMMs are used as main memory modules.

As is known, the memory devices exist in a multiplicity of variants that differ not only in respect to the housing but also in respect to their organizational forms and operation modes.

The different organizational forms have an effect, in particular, on the size of the units in which the data that are to be stored in the respective memory device or are stored therein are to be input or are output. More precisely, the organizational form defines inter alia how many bits or bytes an individual datum that is to be input or is output respectively has. Depending on this, the address to be applied to the memory device so that a specific memory area can be accessed may also vary.

The different operation modes have an effect, inter alia, on the driving of the respective memory module and the particular reaction of the memory module to the driving. Examples of different operation modes are the EDO (enhanced or extended data out) mode, FPM (fast page mode), different types of refresh cycles, etc.

The organizational form and the operation modes must be adapted to the respective external circuitry of the memory module (the controller which drives the circuitry or vice versa).

The various housings differ in respect to the number of terminal elements (e.g. pins) they have, in particular in respect to the number of terminal elements for address and data input and/or output. The number of terminal elements depending on the organizational form chosen, and in respect of the way in which they can be mounted on the printed circuit boards.

The housing of the memory devices shown in FIG. 2 is a so-called SOJ housing, which is very often used for memory devices and, for its part, is likewise manufactured once again in a variety of embodiments having different numbers of terminal elements.

The multiplicity of different housings and also the multiplicity of different organizational forms and operation modes of the integrated circuits require, as may be recognized, frequent changeovers (material and tool changes) during the fabrication of the memory devices and render efficient inventory management virtually impossible.

Therefore, a transition has been made to fabricating and using integrated circuits which, after they have been fabricated, can be configured more or less freely in respect to their organizational form and their operation modes, in other words can be used for a multiplicity of different (memory) devices.

By way of example, the configuration can be realized in this case by providing electrical connections selectively between specific contact points of those constructed on the integrated circuit. The electrical connections are wire connections (interconnections) which are provided within the housing and are fabricated by bonding, for example.

By virtue of such interconnections, which are preferably not implemented until the integrated circuit is accommodated in the housing, which is still adapted to the individual requirements, the integrated circuit can be put as desired into different operating modes by which the integrated circuit is respectively assigned a quite specific organizational form and quite specific operation modes.

The provision of one and the same integrated circuit as a starting product for a multiplicity of memory devices which operate in different ways and the configuration (individualization) thereof which takes place only at the end of the fabrication process simplify the fabrication of the different memory devices enormously.

Nevertheless, the fabrication of such memory devices is still a relatively laborious process because the configuration of the integrated circuit may require, depending on the construction of the housing in which the integrated circuit is to be accommodated, a different procedure and hence the use of different tools as well.

SUMMARY OF THE INVENTION

It is accordingly an object of the invention to provide an integrated circuit with a housing accommodating the integrated circuit that overcomes the above-mentioned disadvantages of the prior art devices of this general type, in which its fabrication can be standardized even further.

With the foregoing and other objects in view there is provided, in accordance with the invention, an electronic circuit, including: an integrated circuit having contact points and a plurality of different operating modes each definable by selecting various combinations of electrical connections between the contact points; and a housing having terminal elements for providing external contact and accommodating the integrated circuit, the contact points of the integrated circuit provided for defining an operating mode and configuration of the integrated circuit connected to the terminal elements.

Accordingly, it is provided that all the contact points of the integrated circuit which are provided for the operation and configuration of the integrated circuit are connected to terminal elements of the housing with which external contact can be made.

In other words, therefore, all the contact points of the integrated circuit are made externally accessible via corresponding terminal elements of the housing. As a result, on the one hand, the diversity of different housing variants can be reduced and, on the other hand, the configuration of integrated circuits that can be used universally can be removed entirely from the device fabrication process.

In this way, the device fabrication can be standardized considerably more extensively than has been the case heretofore.

The selection of which of the contact points of the integrated circuit are actually used (connected to external circuitry or interconnected), the contact points being lengthened outward in their entirety, can be made by the printed circuit board on which the relevant devices are to be mounted. This can be done, by way of example (but not exclusively), as follows: the printed circuit board can be brought onto contact (soldered) only with those terminal points of the device which are actually required for the planned use.

The configuration of the integrated circuit can also be defined by the printed circuit board. All that is necessary for this purpose is that the printed circuit board contain corresponding conductor tracks which connect the contact points of the integrated circuit which are to be connected in order to activate a specific operating mode, more precisely the terminal points of the housing which are connected to the contact points.

Other features which are considered as characteristic for the invention are set forth in the appended claims.

Although the invention is illustrated and described herein as embodied in an integrated circuit with a housing accommodating the integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
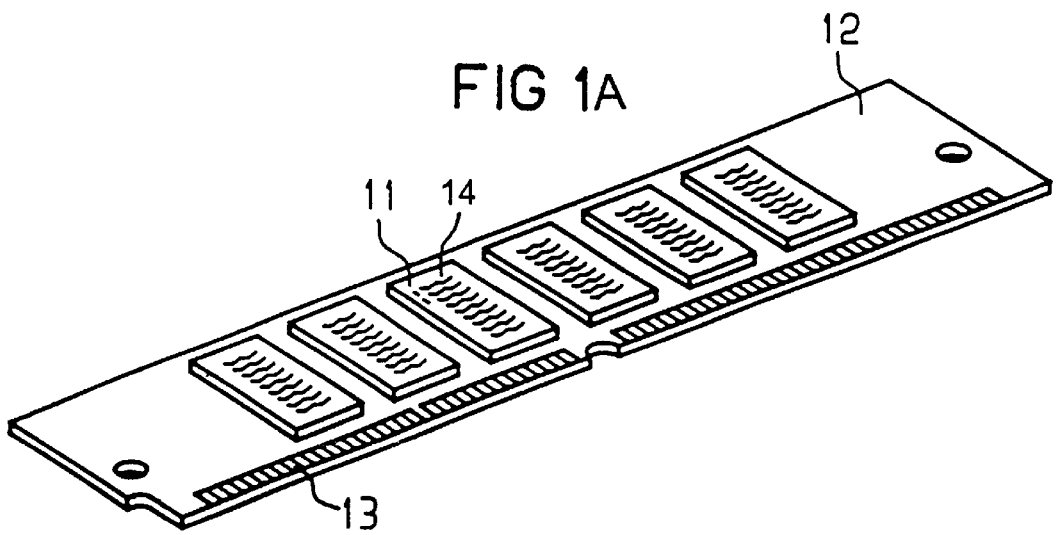
FIG. 1a is a perspective view of a SIMM equipped with memory devices configured according to the invention.

In principle, the invention described below can be applied to integrated circuits of any kind. However, it is particularly suitable for use in integrated circuits which, to a certain extent, can be used universally in the first instance, i.e. after they have been fabricated, and can be individualized only at a later stage by a change in the hardware configuration. The individualization process can, in principle, involve any desired individualization of the integrated circuit. However, the invention can be used particularly advantageously with those integrated circuits in which the individualization can be implemented by the selective connection of contact points provided on the integrated circuit.

In principle, the integrated circuit with the housing accommodating the integrated circuit, according to the invention, is based on the same integrated circuits as has been the case heretofore. In other words, the integrated circuits require no alteration, in any event no significant alteration.

The invention is described below with reference to a SIMM equipped with memory devices constructed according to the invention. It goes without saying, however, that so-called DIMMs (dual inline memory modules) can also be equipped with the devices configured according to the invention. Furthermore, the invention can also be used with memory devices that are not provided for SIMM and/or DIMS fabrication, and, moreover, the devices involved need not necessarily be memory devices, as already mentioned above.

The memory device configured according to the invention includes an integrated circuit and a housing accommodating the integrated circuit.

The integrated circuit is a semiconductor chip having a multiplicity of contact points (normally along the edges of the chip). The contact points have individually differing functions. They are used partly (predominantly) for the input and/or output of supply voltages and also address, data and control signals, and partly for the selection of a specific operating mode of the integrated circuit, more precisely for the definition of a specific organizational form and specific operation modes thereof.

All the contact points of the integrated circuit, at least all the contact points which are provided for the operation and configuration of the integrated circuit, are connected to corresponding terminal elements of the housing and are thus accessible from outside the respective device.

The terminal elements to be provided on the housing are provided there in a number that essentially corresponds to the number of contact points of the relevant integrated circuit.

To date, only some of the contact points of the integrated circuits of the type considered have been connected to terminal elements on the housing. More precisely, the contact points of the integrated circuit which have been made externally accessible were in each case only those which were indispensable for the respective purpose of use.

Consequently, the number of terminal elements of the housing is considerably higher in the case of the device according to the invention than in the case of comparable conventional devices.

In order to prevent the size of the relevant device from also increasing to the same extent as a result of this, housing forms are preferably used which permit the provision of a maximum number of terminal elements per unit area. The housings which are primarily appropriate for this purpose are those which, an example being the so-called chip scaled packages (CSPs), are provided with terminal points (rows of terminals), which can be connected (soldered) to the printed circuit board, not only along the respective edges of the housing but also further inside as well. Although the explanations below are partly based on the use of CSPs as housings, there is no restriction thereto; other housings can also be used. The so-called ball grid arrays (BGAs) are one of the possible alternatives to CSPs.

Figure 2:
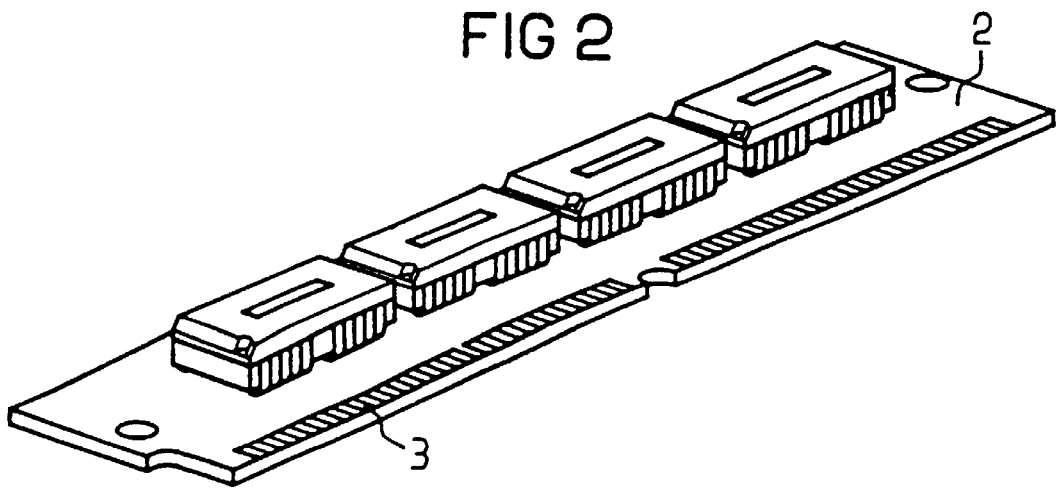
FIG. 2 is a perspective view of the SIMM according to the prior art.

In all the figures of the drawing, sub-features and integral parts that correspond to one another bear the same reference symbol in each case. Referring now to the figures of the drawing in detail and first, particularly, to FIG. 1a thereof, there is shown a SIMM which is equipped with integrated circuits, including memory devices 11, accommodated according to the invention in CSPs. The memory devices 11 are soldered onto a printed circuit board 12. The printed circuit board 12 is provided, like the conventional printed circuit board 2 shown in FIG. 2, with a multiplicity of contact elements 3, 13 along one of its edges. The contact elements 13 are situated next to one another, with the result that it can be plugged onto a further printed circuit board (not shown in the figure), more precisely into a printed circuit board connector provided on the further printed circuit board.

The device could even be configured to be considerably smaller by omitting a housing 14 covering the memory device 11, that is to say by directly mounting (adhesively bonding) the integrated circuit 11 onto the printed circuit board 12 and electrically connecting the same by bonding (chip on board mounting). Nevertheless, it is preferable, despite the increased outlay that has to be accepted, not to dispense with the housing 14.

This is because the presence of the housing 14 is a not insignificant prerequisite for being able to subject the integrated circuit 11 to comprehensive qualitative and quantitative checking and artificial aging prior to it being mounted onto the printed circuit board 12. By this (and only by this) it is possible reliably to ensure that the memory devices 11 mounted on the printed circuit board 12 are free from defects and have equivalent technical properties (e.g. reaction times and/or speeds).

In the case of the chip on board mounting mentioned above, it not infrequently happens, despite all endeavors to prevent it, that defective integrated circuits 11 or ones having different properties from one another are mounted onto the printed circuit board 12. If such a deficiency is not ascertained until after mounting onto the printed circuit board 12, it requires a disproportionately high outlay to rectify it, if this is possible at all, so that ultimately the disadvantages of chip on board mounting surprisingly outweigh the apparent advantages (small size and simpler fabrication of the devices).

Figure 1B:
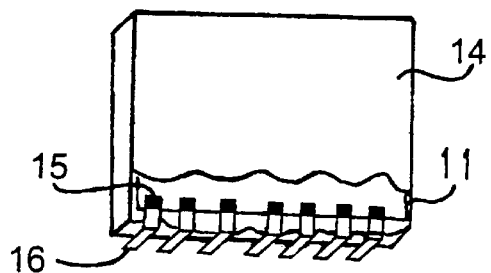
FIG. 1b is a partially cut away view of the memory device.

By virtue of the fact that essentially all contact points 15 of the integrated circuit 11 are connected to corresponding terminal points 16 of the housing 14, in other words it is possible to establish contact with all the contact points 15 even from outside the respective integrated circuit 11, the respective device need not be individualized, in whatever manner, during its fabrication (also see FIG. 1b). Rather, the individualization process can be deferred until the integrated circuit 11 is mounted onto a printed circuit board 12 or even later.

Consequently, the integrated circuits 11 can be produced independently of their subsequent use (their organizational form, operation modes, etc.) in a fabrication process which is completely uniform (has no individual peculiarities). Furthermore, the necessity of stocking a multiplicity of differently configured integrated circuits 11 provided for different purposes of use is also obviated (for the reason just mentioned).

The configuration of the integrated circuit 11 can be effected by the printed circuit board 12 itself, onto which the respective integrated circuit 11 is to be mounted.

In the simplest case, the printed circuit board 12 has conductor tracks via which, in the case of an integrated circuit 11 mounted (soldered) thereon, electrical connections are established between the contact points which are to be connected in order to set a specific operating mode.

Between terminal elements 16 of the housing 14 which are not intended to be connected to one another, either conductor tracks connecting the terminal elements 16 are not provided or contact-making of the terminal elements 16 by the printed circuit board 12 is entirely dispensed with. This can be achieved in a particularly simple and reliable manner as follows: terminal points to which the relevant terminal elements of the integrated circuit (circuit housing) can be connected (soldered) are not provided on the printed circuit board. Moreover, by way of example, the same also applies correspondingly to those terminal elements of the integrated circuit which represent address and/or data lines which are not required in the integrated circuit configuration set (by the printed circuit board).

As an alternative or in addition, provision may be made for implementing the establishment and/or interruption of the connections by manual or electrical actuation of switches or the like provided on the printed circuit board. As a result, the individual configuration could not only be deferred even further but even adapted to changing requirements during practical use.

The integrated circuit with the housing accommodating the integrated circuit as described makes it possible for devices based on the same integrated circuit in each case to be configured only after they have been fabricated, and, consequently, completely independently of the respective purpose of use. In other words, enables the integrated circuits to be fabricated uniformly without individual peculiarities.

We claim:

1. An electronic circuit, comprising:
   an integrated circuit with a plurality of contact points and a plurality of different operating modes each definable by selecting various combinations of electrical connections between the contact points;
   a housing accommodating said integrated circuit and having terminal elements for providing external contact, the contact points of the integrated circuit provided for defining the plurality of different operating modes and configuration of the integrated circuit being connected to the terminal elements and thereby externally accessible via said corresponding terminal elements of said housing.

2. The electronic circuit according to claim 1, wherein said integrated circuit is a memory device suitable for equipping a single inline memory module (SIMM).

3. The electronic circuit according to claim 1, wherein said integrated circuit is a memory device suitable for equipping a dual inline memory module (DIMM).

4. The electronic circuit according to claim 1, wherein said housing is a chip scaled package (CSP) housing.

5. The electronic circuit according to claim 1, wherein said housing is a ball grid array (BGA) housing.

6. The electronic circuit according to claim 1, wherein all of said terminal elements of said housing are disposed such that said terminal elements can be soldered to corresponding terminal points on a printed circuit board.

7. The electronic circuit according to claim 1, wherein the plurality of different operating modes are provided for permanently adapting said integrated circuit for individual use at an individual location of use of said integrated circuit.

8. The electronic circuit according to claim 1, wherein said integrated circuit is a memory device, a choice of an operating mode making it possible to define at least one of an organizational form of said memory device and the operating mode of said memory device.

* * * * *

UNITED STATES PATENT AND TRADEMARK OFFICE
CERTIFICATE OF CORRECTION

PATENT NO.   : 6,573,593 B1
DATED        : June 3, 2003
INVENTOR(S)  : Erich Syri et al.

It is certified that error appears in the above-identified patent and that said Letters Patent is hereby corrected as shown below:

<u>Title page,</u>
Item [30], should read as follows:
-- Sep. 18, 1996    (DE) ............... 196 38 175 --

Signed and Sealed this

Eleventh Day of November, 2003

JAMES E. ROGAN
*Director of the United States Patent and Trademark Office*